United States Patent [19]

Miyamoto

[11] Patent Number: 4,920,512
[45] Date of Patent: Apr. 24, 1990

[54] NON-VOLATILE SEMICONDUCTOR MEMORY CAPABLE OF READILY ERASING DATA

[75] Inventor: Hiroshi Miyamoto, Hyogo, Japan

[73] Assignee: Mitsubishi Denki Kabushiki Kaisha, Tokyo, Japan

[21] Appl. No.: 213,106

[22] Filed: Jun. 28, 1988

[30] Foreign Application Priority Data

Jun. 30, 1987 [JP] Japan ................... 62-160837
Jul. 13, 1987 [JP] Japan ................... 62-175250

[51] Int. Cl.$^5$ ............... G11C 7/00; G11C 11/40; G11C 11/44
[52] U.S. Cl. ........................... 365/160; 365/218; 365/185; 357/23.5; 357/5; 505/1
[58] Field of Search ............... 365/94, 104, 160, 185; 357/23.5, 5; 307/462; 305/832, 834; 505/1, 732

[56] References Cited

U.S. PATENT DOCUMENTS

| 3,852,795 | 12/1974 | Ames .................... 357/5 |
| 4,334,158 | 6/1982 | Faris .................... 307/462 |
| 4,336,523 | 6/1982 | Jaggi .................... 365/160 X |
| 4,365,317 | 12/1982 | Gheewala ............... 365/160 X |
| 4,698,787 | 10/1987 | Mukherjee et al. ....... 365/185 |
| 4,754,320 | 6/1988 | Mizutani et al. ......... 365/185 X |
| 4,774,202 | 9/1988 | Pan et al. .............. 365/185 X |
| 4,803,529 | 2/1989 | Masuoka ................ 365/185 X |
| 4,812,898 | 3/1989 | Sumihiro ................ 365/185 X |
| 4,823,318 | 4/1989 | D'Arrigo et al. ......... 365/185 X |

FOREIGN PATENT DOCUMENTS

| 61-206280 | 9/1985 | Japan .................... 357/5 |
| 63-234574 | 9/1988 | Japan .................... 357/5 |
| 63-291436 | 11/1988 | Japan .................... 505/1 |

OTHER PUBLICATIONS

"Epitaxial Films of YBa$_2$Cu$_3$O$_{7-8}$ on NdGaO$_3$, LaGaO$_3$ and SrTiO$_3$ Substrates Deposited by Laser Ablation"; G. Koren et al., Applied Phys Letters 54(11), Mar. 13, 1989, pp. 1054–1056.

"New Superconductor Containing Copper Oxides"; disclosed anonymously, Research Disclosure, Apr. 1989, No. 30, Kenneth Mason Publications, England.

Primary Examiner—Stuart N. Hecker
Assistant Examiner—Alyssa H. Bowler
Attorney, Agent, or Firm—Lowe, Price, LeBlanc, Becker & Shur

[57] ABSTRACT

An EPROM in which data can be easily erased comprises a P type semiconductor substrate; source.drain regions formed on a main surface of the P type semiconductor substrate, a floating gate for storing charges representing information formed on a region sandwiched by the source.drain regions with an insulating film interposed therebetween, a superconductive material which will be the switching device formed on the floating gate, and a control gate formed on the superconductive material. In the normal operation, the superconductive material is non-conductive, so that the charges representing information are held in the floating gate. When the charges representing information in the floating gate should be erased, the whole EPROM is cooled, and the charges are discharged through the superconductive material and the control gate. By the use of a superconducting material in this fashion, other structures enabling erasure such as UV-radiation windows and tunnel oxide films may be omitted without increasing the chip area of the non-volatile memory.

8 Claims, 10 Drawing Sheets

NON-VOLATILE SEMICONDUCTOR MEMORY CAPABLE OF READILY ERASING DATA

BACKGROUND OF THE INVENTION

1. Field of the Invention

The present invention relates to a non-volatile semiconductor memory (hereinafter referred to as EPROM, erasable programmable read only memory), and more specifically to an EPROM in which data can be easily erased.

2. Description of the Prior Art

Figure 1:
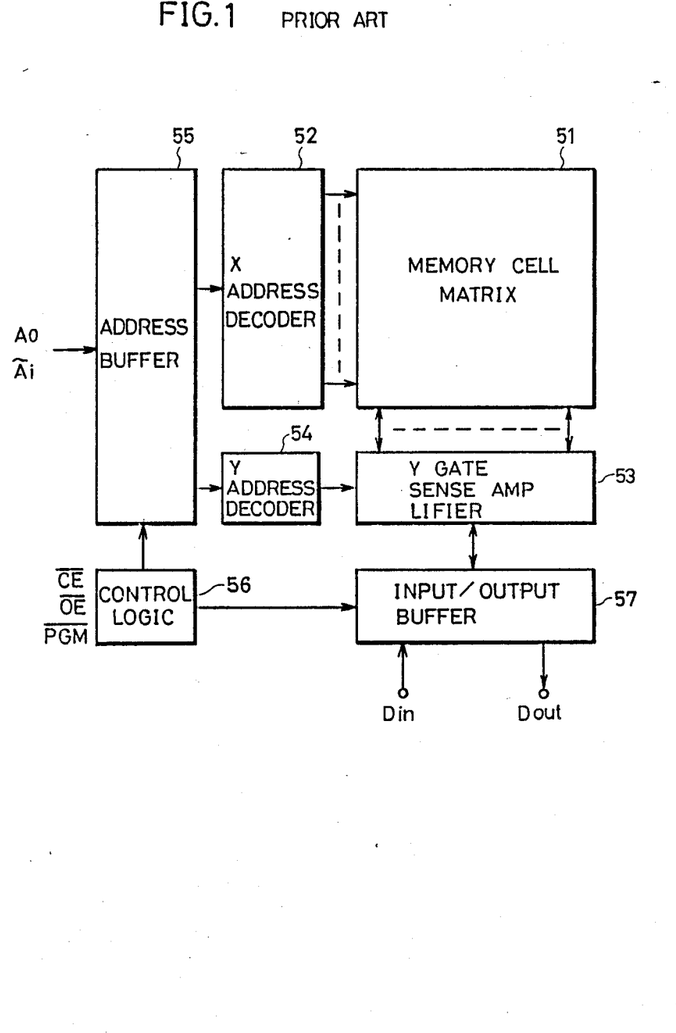
FIG. 1 is a block diagram showing a structure of a common UV-EPROM.

FIG. 1 is a block diagram showing a structure of a conventional UV-EPROM (Ultra-Violet EPROM).

Figure 2:
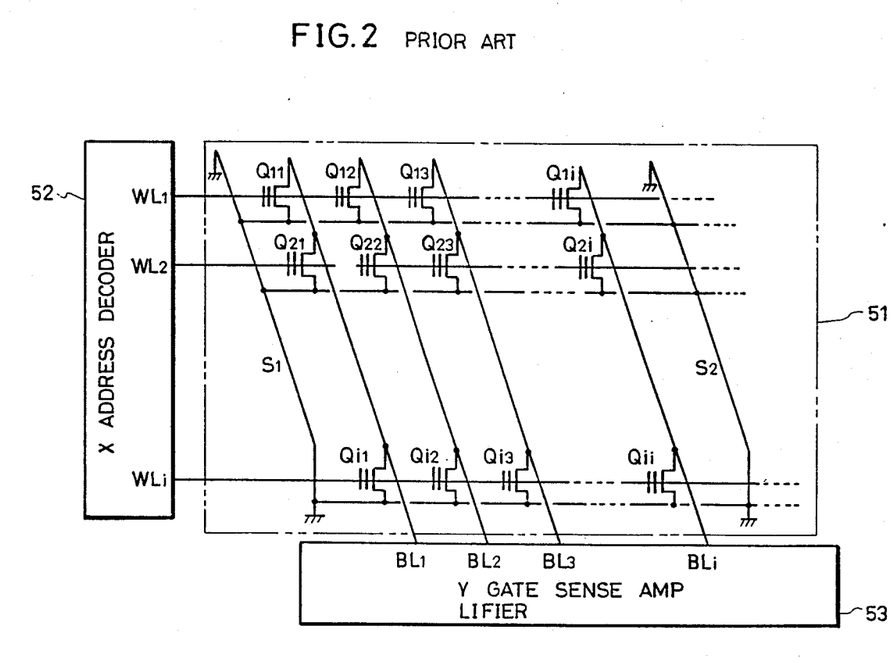
FIG. 2 is a perspective view showing schematic structure of a memory cell matrix.

Referring to the figure, a X address decoder 52 and a Y gate sense amplifier 53 for selecting rows and columns of memory cells are connected to a memory cell matrix 51 comprising a plurality of memory transistors (which will be described later) arranged in rows and columns. A Y address decoder 54 which supplies column selecting information is connected to the Y gate sense amplifier 53 and the X address decoder 52 and the Y address decoder 54 are respectively connected to an address buffer 55 in which address information is temporarily stored. An input-output buffer 57 which temporarily stores input-output data is connected to the Y gate sense amplifier 53. The address buffer 55 and the input-output buffer 57 are connected to a control logic 56 which controls the operation of the EPROM. The control logic 56 controls in accordance with a chip enable signal $\overline{CE}$ an output enable signal $\overline{OE}$ and a program signal $\overline{PGM}$ FIG. 2 is a perspective view showing schematic structure of the memory cell matrix 51 shown in FIG. 1.

In the figure, a plurality of word lines $WL_1$, $WL_2$... $WL_i$ are arranged in the row direction and a plurality of bit lines $BL_1$, $BL_2$, ... $BL_i$ are arranged in the column direction so as to intersect the word lines orthogonally, thereby forming a matrix. Memory transistors $Q_{11}$, $Q_{12}$, ... $Q_{ii}$ each having a floating gate are arranged at respective intersections of the word lines and the bit lines. The memory transistor has its drain connected to each bit line, its control gate connected to each word line and its source connected to each of ground lines ($S_1$, $S_2$ ...). As is shown in the figure, the sources of the memory transistors belonging to the same row are connected to each other and to the ground lines ($S_1$, $S_2$...,) arranged on both sides.

Figure 3:
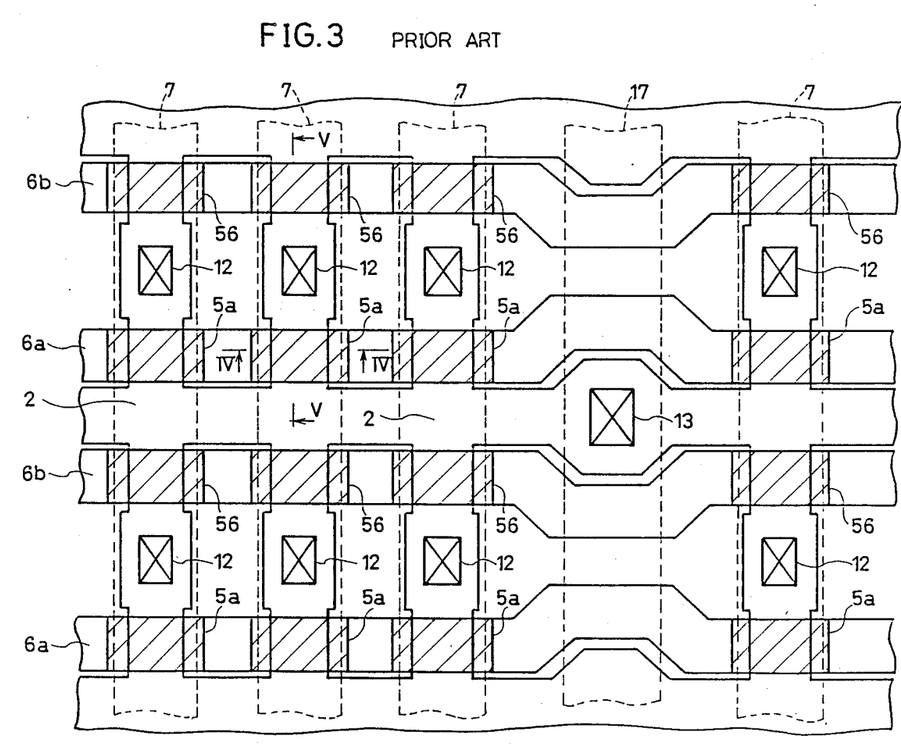
FIG. 3 is a plan view of a conventional memory cell matrix.
Figure 4:
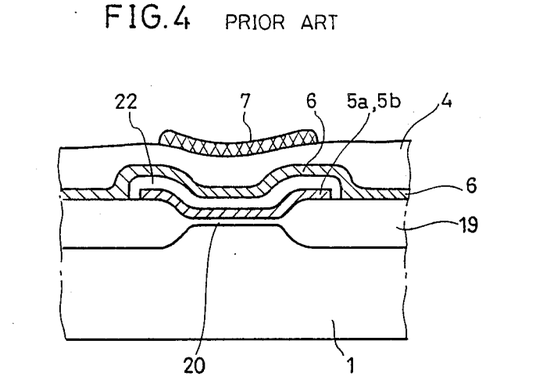
FIG. 4 is a cross sectional view of the portion shown by the line IV-IV of FIG. 3.
Figure 5:
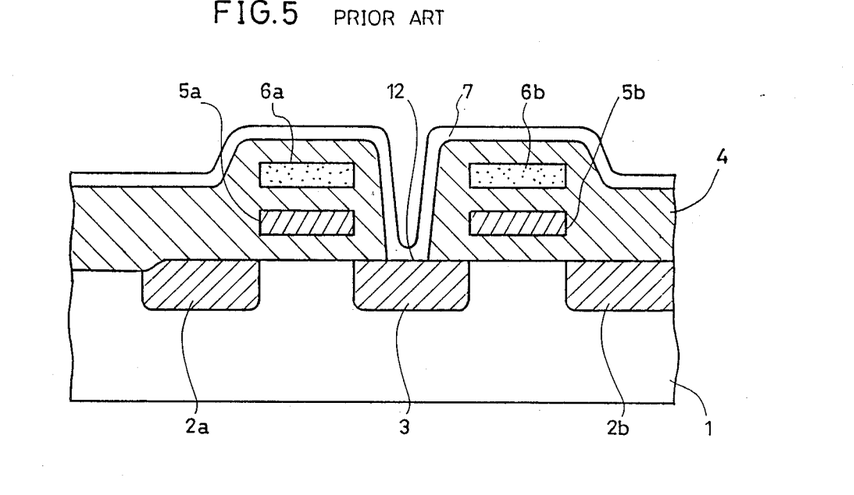
FIG. 5 is a cross sectional view of a portion shown by the line V-V of FIG. 3.

FIG. 3 is a plan view showing a portion of the definite structure of a conventional memory cell matrix and FIGS. 4 and 5 are cross sectional views taken along the lines IV—IV and V—V of FIG. 3, respectively.

Referring to FIGS. 3 to 5, the structure of the memory cell will be described. An N+ impurity region 3 which will be the drain region of the memory transistor and N+impurity regions 2a and 2b which will be the source regions are formed on a main surface of a semiconductor substrate 1. Floating gates 5a and 5b are formed on channel regions which are sandwiched by the N+ impurity regions 3, 2a and 2b with a first gate oxide film 4 interposed therebetween. The first gate oxide film 20 is sandwiched by a thick isolating oxide film 19 formed on the main surface of the semiconductor substrate 1 whereby the active region thereof is defined. Control gates 6a and 6b formed of polycide are formed on the floating gates 5a and 5b with a second gate oxide film 22 interposed therebetween, the control gates 6a and 6b of respective transistors are tied to each other in the row direction to form a word line 6. An interlayer insulating film is formed on the entire surface of the main surface of the semiconductor substrate 1 to cover the word line 6. Contact holes 12 to provide contact between the impurity regions 2a and 2b and the bit lines are provided on the interlayer insulating film 4. Bit lines 7 formed of aluminum wiring are formed in the column direction on the entire insulating film 4. Impurity regions 2a and 2b which will be the source regions are connected with each other and extend in the row direction and are connected to the source lines 17 extending in the column direction through the contact holes 13. Although not shown in the figure, normally one source line ($S_1$, $S_2$ ... ) 17 is provided for every sixteen bit lines 7.

The writing operation to the memory transistors in the EPROM structured as above will be briefly described referring to FIGS. 1 to 6.

Address signals $A_O$ to $A_i$ which will be X address signals (word line selecting signals) and Y address signals (bit line selecting signals) are time sequentially inputted to the address buffer 55 and these signals are applied to the Y gate sense amplifier 53 through the X address decoder 52 and the Y address decoder 54, respectively. Consequently, one word line and one bit line are selected and a high voltage $V_{pp}$ (about 12.5 V in the case of 1 M bit degree of integration) is applied thereto. On this occasion, the non-selected word lines and all source lines are brought to the ground level and the non-selected bit lines BL are brought to the floating state.

Consequently, a high voltage $V_{pp}$ is applied to the control gate and the drain region of the memory transistor to which the selected word lines and bit lines are connected, and, since the potential of the source region is at the ground level, a relatively large current flows to the channel of the transistor. Therefore, hot electrons are implanted to the gate oxide film near the drain region 3 and to the floating gates 5a and 5b due to the electric field in the oxide film. As a result, electrons are stored in the floating gates 5a and 5b, causing increase of the threshold voltage of the transistor. Thus, the writing is carried out. The electrons stored in the floating gates 5a and 5b are maintained even after the application of the high voltage $V_{pp}$ since the surroundings of the floating gates 5a and 5b are covered with the insulating film.

Figure 6:
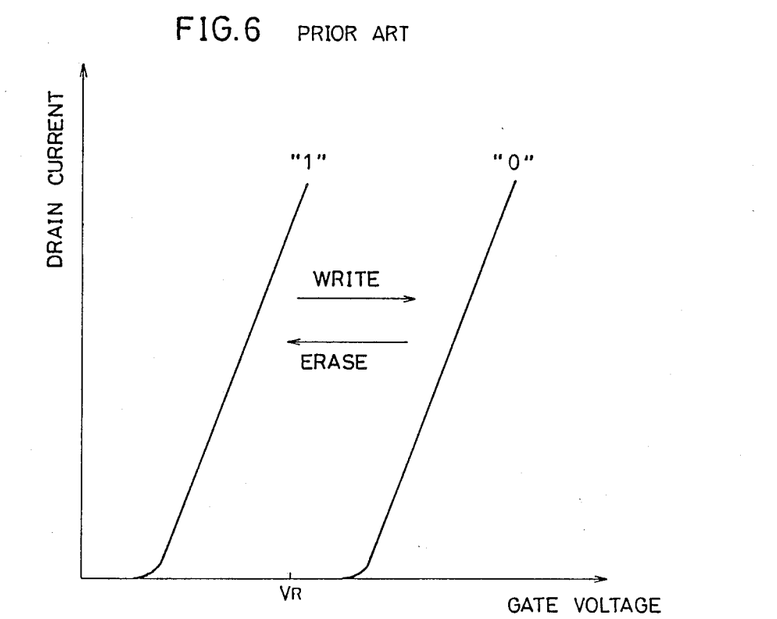
FIG. 6 is a graph showing the voltage current characteristics of the memory transistor.

FIG. 6 is a graph showing a current voltage characteristic of a memory transistor in the erased and written states. The written and erased states are defined by the presence absence of the electrons in the floating gates of the transistor as described above. As is shown in the figure, the threshold voltage of the memory transistor at the written state (storing "0") is different from that in the erased state (storing "1"). Therefore, non-volatile information can be obtained by setting the intermediate value as a reading gate voltage $V_R$. More specifically, at the reading gate voltage $V_R$ shown in the figure, the memory transistor in the written state becomes non-conductive, so that no current flows to the bit line. Meanwhile, the memory transistor in the erased state becomes conductive, so that current flows to the bit line.

Next, the reading operation of the memory transistor of the EPROM will be briefly described with reference, to FIGS. 1 to 5.

In the similar manner as the above described writing operation, address signals $A_0$ to $A_i$ which will be the X address signals and Y address signals are time sequentially inputted to the address buffer 5 and one word line and one bit line are selected. Let us consider a case in which a word line $WL_2$ and a bit line $BL_2$ are selected, for example. In this case, the presence absence of information in the memory transistor $Q_{22}$ is read. A voltage $V_R$ is applied to the word line $WL_2$ while a prescribed voltage is applied to the bit line $BL_2$. Other non-selected word lines and all source lines are brought to the ground level and other non-selected bit lines are brought to the floating state. Consequently, a prescribed voltage is applied to the drain region of the transistor $Q_{22}$, and, since the source region is at the ground potential, a drain current flows between the source and drain regions if the transistor $Q_{22}$ is in the erased state. This means that a current flows to the bit line $BL_2$. Meanwhile, if the transistor $Q_{22}$ is in the written state, it is difficult for a current to flow between the source and drain regions, that is, the bit line $BL_2$. The amount of current flow in the selected bit line $BL_2$ brings a change of voltage applied to the bit line $BL_2$, and this change is detected and amplified by the Y gate sense amplifier 53 using the reference voltage as a reference. The reading operation is carried out by taking out the detected and amplified voltage signal through the input/output buffer 57 as information.

Figure 7:
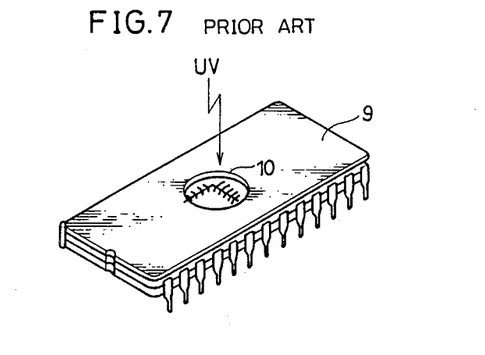
FIG. 7 shows a package of a conventional EPROM.

Description will be given of a case in which the stored data is erased. The erasure of the stored data is to bring all memory transistors to the state of "0" again by discharging electrons from the floating gates of the memory transistors storing electrons. The erasure of the stored data is carried out by irradiating ultraviolet rays (UV) on the surface of an IC chip to discharge electrons from all floating gates to the conduction band of the semiconductor substrate by light excitation. Therefore, the EPROM is usually contained in a package 9 having a window 10 for irradiating ultraviolet rays as shown in FIG. 7.

As described above, since a conventional EPROM should be irradiated by ultraviolet rays in erasing data, a window must be provided on the package. In addition, a special glass is used for the window, so that the package is more expensive than a package of for example an EEPROM in which the data can be erased without using ultraviolet rays. Therefore, it increases the cost of the EPROM.

Figure 8:
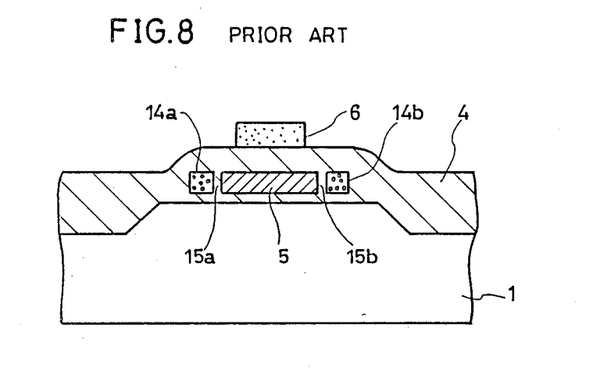
FIG. 8 shows a schematic structure of a conventional EEPROM.

FIG. 8 is a schematic cross sectional view of an EEPROM in which the erasure of information is carried out electrically. Referring to FIG. 8, a conventional EEPROM has a similar structure as the EPROM shown in FIG. 5. More specifically, the EEPROM comprises a floating gate formed on a main surface of a P type semiconductor substrate 1 for storing charges representing information, a control gate 6 for applying-potential to the floating gate, an N type impurity region, not shown, and erasing gates 14a and 14b for erasing charges stored in the floating gate. In the EEPROM, the writing is carried out in the similar manner as the writing of EPROM. In erasing, a high voltage is applied to the erasing gates 14a and 14b and the electrons stored in the floating gate are discharged to the erasing gates due to the tunnel phenomenon through tunneling insulating layers 15a and 15b.

However, the tunneling insulating films and the erasing gates should be provided independently from the essential components. Therefore, the area per 1 bit memory cell becomes larger, increasing the size of the chip.

SUMMARY OF THE INVENTION

Therefore, one object of the present invention is to provide a non-volatile semiconductor memory in which the area occupied by one memory cell can be reduced.

Another object of the present invention is to provide a non-volatile semiconductor memory which is inexpensive.

A further object of the present invention is to provide a non-volatile semiconductor memory in which data can be erased without using ultraviolet rays.

A still further object of the present invention is to provide a non-volatile semiconductor memory whose package is inexpensive.

A still further object of the present invention is to provide a non-volatile semiconductor memory in which data can be erased by using switching means.

A still further object of the present invention is to provide a non-volatile semiconductor memory in which data can be erased by using a superconductive material.

The above described objects of the present invention can be attained by a non-volatile semiconductor memory comprising: a semiconductor substrate having a main surface and a predetermined impurity concentration of a first conductivity type; impurity regions of a second conductivity type formed spaced apart with each other on the main surface of the semiconductor substrate, a space between the impurity regions of the second conductivity type defining a channel region; a first conductive layer formed at least on the channel region with an insulating film interposed therebetween; a second conductive layer extending near the first conductive layer and maintained at a prescribed potential; a third conductive layer formed on the first conductive layer with an insulating film interposed therebetween; and switching means for connecting the first conductive layer and the second conductive layer.

Since the non-volatile semiconductor device comprises the above described components, the charges representing information held in the first conductive layer is discharged through the second conductive layer by the operation of the switching device. Therefore, the window for irradiating ultraviolet rays or the tunnel insulating film for erasing charges representing information can be eliminated. Consequently, a non-volatile semiconductor memory can be provided in which the area occupied by one memory cell can be reduced.

According to a preferred embodiment, the switching device comprises a superconductive material. Since the switching device is superconductive, the charges representing information can be discharged merely by lowering the temperature of the device. Consequently, the data can be erased without using ultraviolet rays. Therefore, the window for ultraviolet ray irradiation can be eliminated. Consequently, a non-volatile semiconductor memory can be provided whose package is inexpensive.

According to a more preferred embodiment, the third conductive layer comprises a second conductive-layer, and the third conductive layer is held at a prescribed potential when the data is erased. Since the non-volatile semiconductor memory comprises the above described component, the second conductive layer can be eliminated. Consequently, a non-volatile semiconductor memory can be provided which has simple structure.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 9:
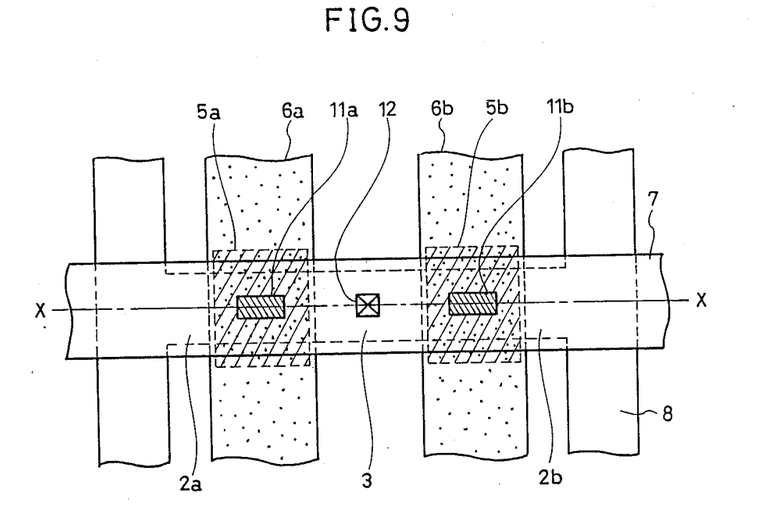
FIG. 9 is a plan view of an EPROM to which the present invention is applied.

One embodiment of the present invention will be described using an EPROM as an example as in the foregoing, with reference to the figures. FIG. 9 is a plan view showing one embodiment of the present invention, FIG. 10 is a cross sectional view taken along the line X-X of FIG. 9 and FIG. 11 is a diagram of an equivalent circuit of one embodiment of the present invention.

Figure 10:
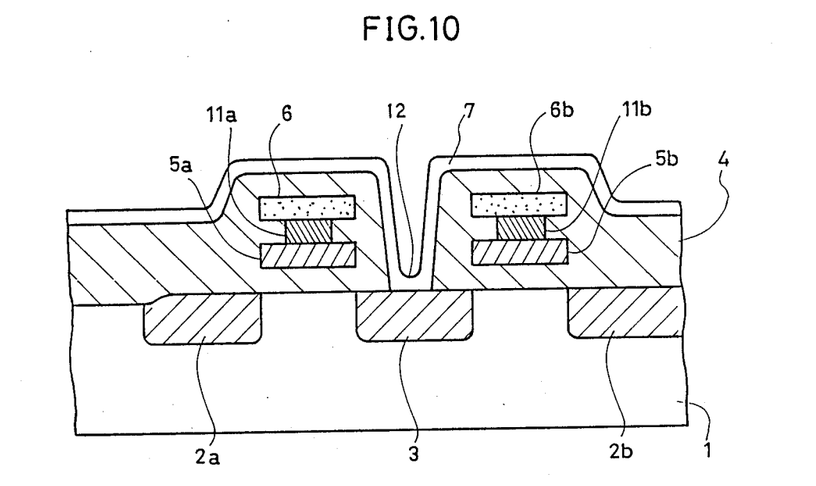
FIG. 10 is a cross sectional view of a portion shown by the line X-X of FIG. 9.
Figure 11:
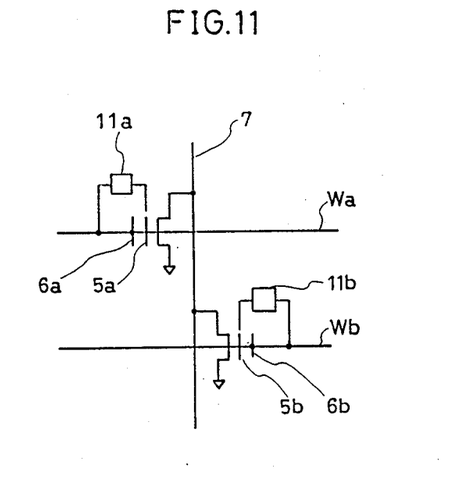
FIG. 11 is a schematic diagram of an equivalent circuit showing one embodiment of the present invention.

Referring to FIGS. 9, 10 and 11, the EPROM in accordance with the present invention comprises switching devices 11a and 11b formed of a superconductor between floating gates 5a and 5b and control gates 6a and 6b. Other structure is the same as the conventional EPROM (FIGS. 4 and 5). The switching devices formed of a superconductor connect respective floating gates 5a and 5b to the word lines Wa and Wb, when viewed from the aspect of the circuit structure. Examples of the superconductor to be employed are as follows: Y system Y-Ba-Cu-O, and Tl system Tl-Ca-Ba-Cu-O.

The operation of one embodiment of the present invention shown in FIGS. 9 to 11 will be described in the following.

In writing and reading information, the circumference of the chip is set at the room temperature (about 25° C.), so that the conductivity of the superconductors 11a and 11b is extremely small. Therefore, each of the superconductors 11a and 11b serves as an insulating film, as does the oxide film 4. Therefore, in the similar manner as described in the foregoing, the, control gate 6a and the floating gate 5a are capacitance coupled without leak, whereby writing and reading of information are carried out.

Meanwhile, the written information is erased in the following manner.

Figure 12:
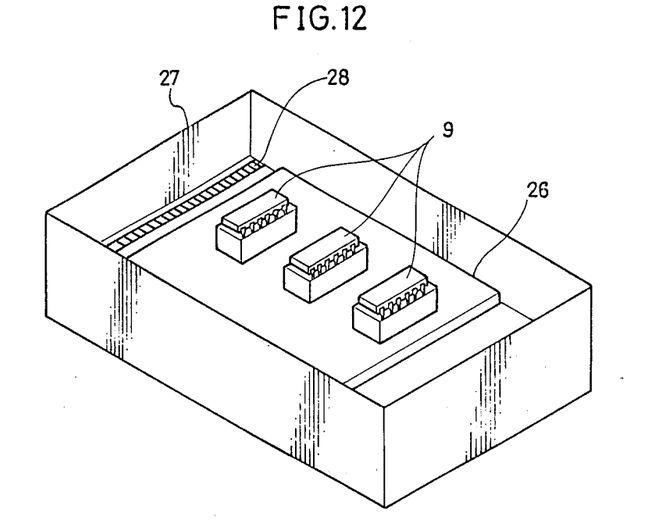
FIG. 12 shows the erased state of the EPROM of the present invention.

As shown in FIG. 12, a board 26 on which packages 9 containing the EPROM is arranged and placed in a container 27 with the connector 28 aligned with the board. In this manner, the outer portion of the container 27 and the board 26 are electrically connected, and a prescribed potential is applied to the EPROM.

Thereafter, the container is made a vacuum in order to prevent frost, and then it is cooled by an electric freezer. Alternately, the container may not be made a vacuum but cooled as it is and then heated so as to evaporate water.

In this manner, the temperature is set at a value where the superconductors 11a and 11b exhibit superconductive characteristics or the conductivity thereof exceeds a prescribed value, and the control gate is set at a prescribed potential, for example, the ground potential. By doing so, the floating gates 5a and 5b are electrically connected to the word lines Wa and Wb through superconductors 11a and 11b and the control gates 6a and 6b, respectively, thereby brought to the ground potential.

Therefore, electrons stored in the floating gate 5a, for example, are eliminated through the superconductor 11a, the control gate 6a and the word line Wa. On this occasion, by simultaneously bringing all word lines of more than 2 bits (not shown) to the ground potential, the information of all bits can be collectively erased.

As for the means for lowering the temperature around the chip, other than the above described freezer, air conditioning or a cooling medium may be used. A general constant voltage source or the ground may be used as means for setting the word line, that is, the control gates 6a and 6b at a prescribed potential.

A method for manufacturing an EPROM in accordance with the present invention will be described with reference to the figures. FIG. 13A to 13E show the method for manufacturing the EPROM in accordance with the present invention in a stepwise manner.

Figure 13A:
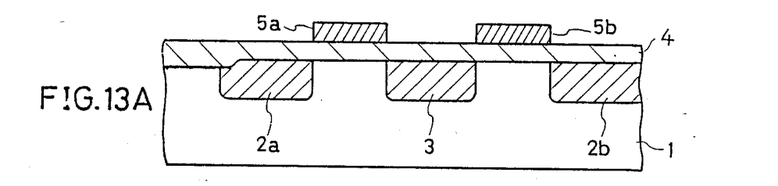
FIGS. 13A to 13E are drawings showing a method for manufacturing the EPROM in accordance with the present invention.
Figure 13B:
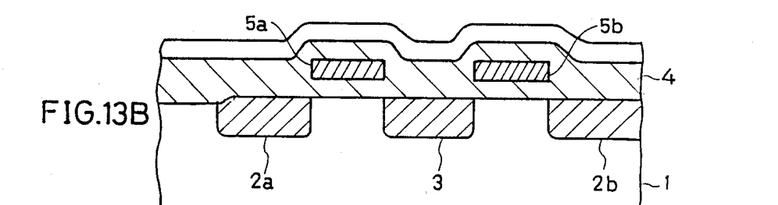
Figure 13C:
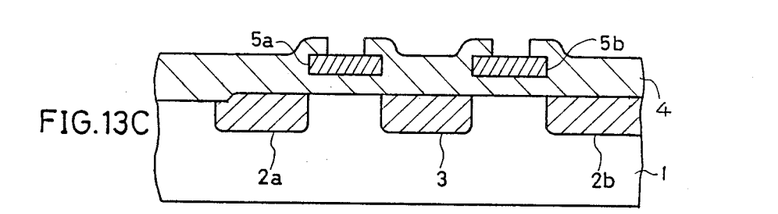

N+ type diffused layers 2a, 2b, 3, an oxide film 4 and floating gates 5a, 5b are formed on a main surface of a P type semiconductor substrate 1 by a known method (FIG. 13A). An oxide film is formed on the floating gates 5a and 5b, and a resist is applied thereon by a known method (FIG. 13B). The resist 25 is patterned, and holes are formed in a portion of the oxide film 4 by a known method using the patterned resist as a mask FIG. 13C).

Figure 13D:
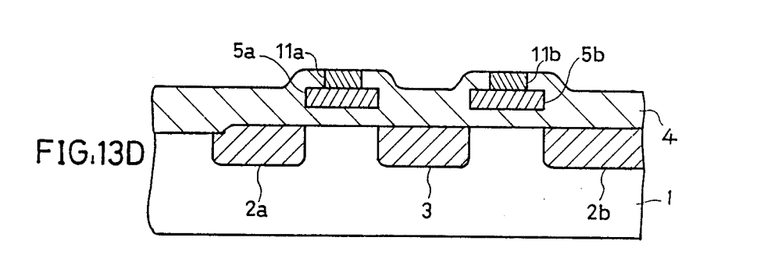
Figure 13E:
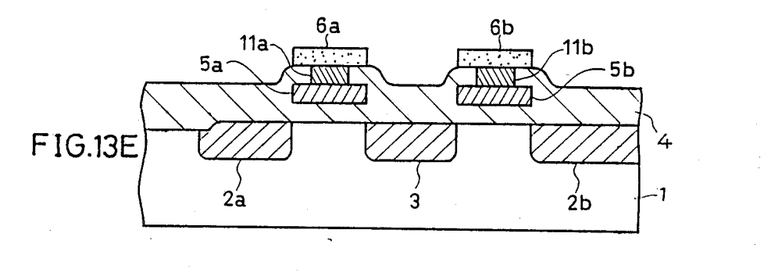

Superconductive materials 11a, 11b are formed only on the floating gates formed of polycrystalline silicon by selective chemical vapor deposition method (FIG. 13D). Control gates (6a, 6b) are formed adjacent to the superconductive materials (11a, 11b) by a known method (FIG. 13E).

As described above, by arranging superconductor 11a and 11b above the floating gates 5a and 5b, the chip area is not increased at all and a compact and inexpensive structure can be provided.

Although a prescribed potential is the ground potential in the above described embodiment, it may be any potential provided that the electrons stored in the floating gate can be eliminated at that potential.

Figure 14:
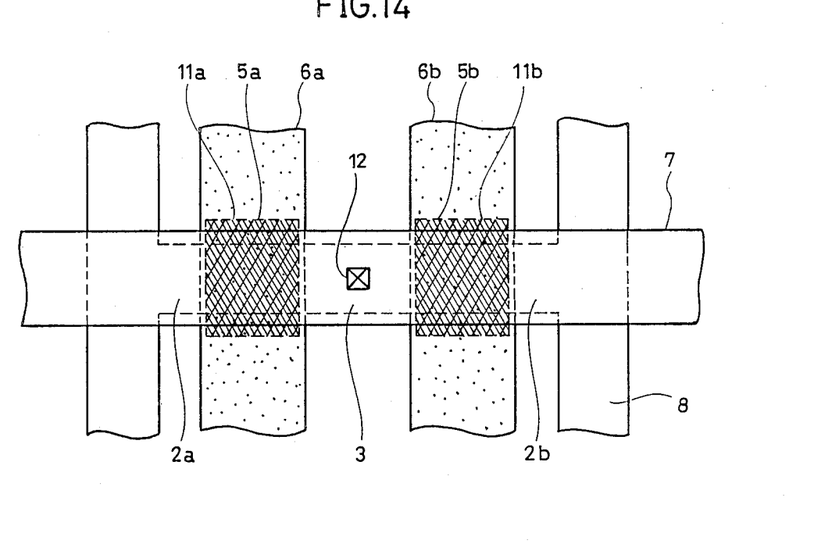
FIGS. 14 and 15 are drawings showing variations of the present invention.
Figure 15:
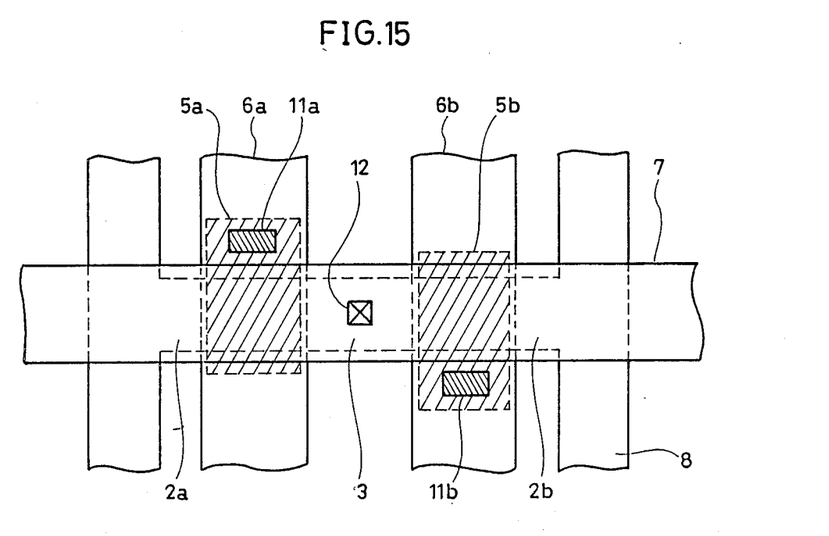

In addition, the superconductors 11a and 11b are provided on a portion of the active region B above the floating gates 5a and 5b, they may be provided entirely on the floating gates 5a and 5b as shown in FIG. 14, or they may be provided at a portion other than the active region B as shown in FIG. 15, provided that they are connected to the control gates 6a and 6b.

Figure 16:
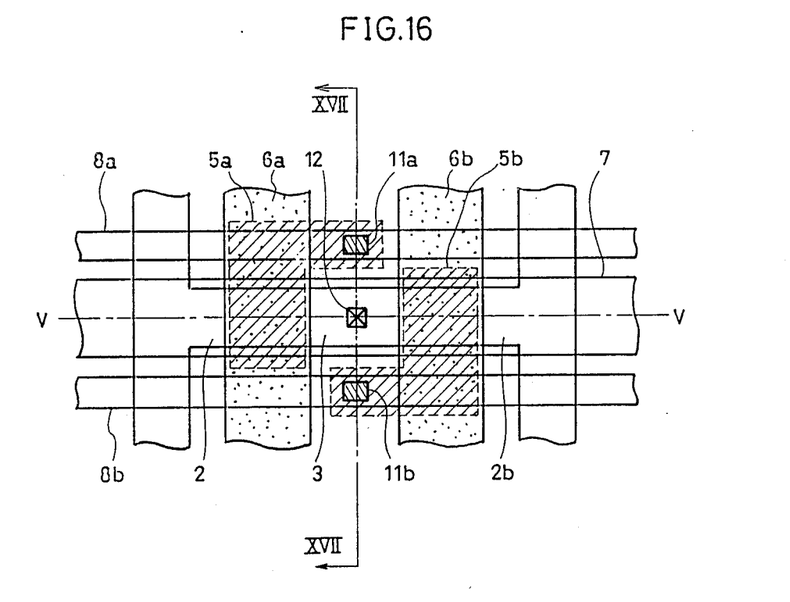
FIG. 16 is a plan view showing another embodiment of the present invention.
Figure 17:
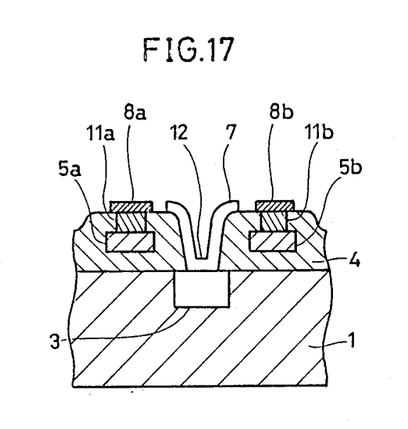
FIG. 17 is a cross sectional view taken along the line XVII-XVII in FIG. 16.
Figure 18:
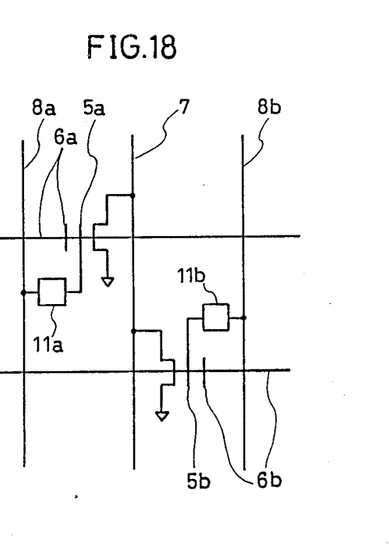
FIG. 18 is an equivalent circuit diagram of the EEPROM shown in FIGS. 16 and 17.

FIG. 16 is a plan view showing another embodiment of the present invention, FIG. 17 is a cross sectional view taken along the line XVII-XVII in FIG. 16 and FIG. 18 is an equivalent circuit diagram of the EEPROM shown in FIGS. 16 and 17.

This embodiment differs from the above described embodiments in that a superconductor serving as switch means is provided between a floating gate and a wiring 8a, 8b connected to a prescribed potential. More specifically, charges stored in the floating gate are discharged to the wires 8a, 8b other than the control gate. Since other structures are the same as those in the above embodiments, the description thereof will be omitted, with corresponding portions denoted by the same reference characters. The cross sectional view taken along the line V-V in FIG. 16 is the same as FIG. 5.

Although description is given employing an EPROM as an example of the non-volatile memory, the present invention may be applied to other non-volatile memories.

In addition, although description is given of a case in which a p type silicon substrate 1 is used as a semiconductor substrate and the sources 2a and 2b are formed of n type silicon regions, other semiconductor substrates may be used to obtain the same effect as in the above described embodiment.

According to the present invention, the floating gate for holding charges representing information and a conductor held at the ground are connected by a superconductive material. Therefore, at normal room temperature, the floating gate is not grounded and the operation of a general non-volatile memory is ensured. Meanwhile, when all electrons in the floating gate should be erased, the whole device is cooled. At that time, the superconductive material becomes electrically conductive, so that the floating gate is grounded and all electrons held in the floating gate are erased. Therefore, the window, the tunnel oxide film and a like required in the prior art to erase electrons from the, floating gate can be dispensed with. Consequently, a non-volatile semiconductor memory can be provided in which the area occupied by one memory cell can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory comprising:
   a semiconductor substrate having a main surface and a predetermined impurity concentration of a first conductivity type;
   impurity regions of a second conductivity type formed spaced apart from each other on the main surface of said semiconductor substrate, an area between said impurity regions of the second conductivity type defining a channel region;
   a first conductive layer formed at least on said channel region with an insulating film interposed therebetween;
   a second conductive layer formed on said first conductive layer with an insulating film interposed therebetween; and
   switching means comprising a superconductive material for connecting said first conductive layer and said second conductive layer.

2. A non-volatile semiconductor memory according to claim 1, wherein
   said superconductive material is formed on and in contact with said first conductive layer, and
   said third conductive layer is formed on and in contact with said superconductive material.

3. A non-volatile semiconductor memory according to claim 2, wherein said non-volatile semiconductor memory comprises an EPROM.

4. A non-volatile semiconductor memory according to claim 2, wherein said non-volatile semiconductor memory comprises an EEPROM.

5. A non-volatile semiconductor memory according to claim 1 wherein said second conductive layer is held at a prescribed potential.

6. A non-volatile semiconductor memory according to claim 1, further including a third conductive layer extending near said first conductive layer and held at a prescribed potential.

7. A floating gate memory device comprising:
   a floating gate of polycrystalline silicon;
   a switching device formed of a superconductive material formed on and in contact with said floating gate; and
   a control gate of polycrystalline silicon formed on and in contact with said switching device; whereby discharge of electrons from said floating gate is carried out through said control gate by the operation of said switching device.

8. A method of controlling the storage of charge in a floating gate of a memory device having a switching device formed of a superconductive material formed on and in contact with said floating gate and a control gate formed on and in contact with said switching device comprising the steps of:
   applying a predetermined potential to said control gate; and
   subjecting the entire memory device to a temperature of a value which alters the conductive property of said superconductive material to thereby actuate said switching device.

* * * * *